(12) United States Patent
Fifield et al.

(10) Patent No.: US 11,703,547 B2
(45) Date of Patent: Jul. 18, 2023

(54) SOFTWARE-CONFIGURABLE BATTERY MANAGEMENT SYSTEMS AND METHODS

(71) Applicant: Maxim Integrated Products, Inc., San Jose, CA (US)

(72) Inventors: Antoine D. Fifield, Mesa, AZ (US); Jiuhui Wang, Gilbert, AZ (US); Daniel James Miller, Gilbert, AZ (US)

(73) Assignee: Maxim Integrated Products, Inc., San Jose, CA (US)

( * ) Notice: Subject to any disclaimer, the term of this patent is extended or adjusted under 35 U.S.C. 154(b) by 352 days.

(21) Appl. No.: 16/372,964

(22) Filed: Apr. 2, 2019

(65) Prior Publication Data

US 2019/0302186 A1    Oct. 3, 2019

Related U.S. Application Data

(60) Provisional application No. 62/652,225, filed on Apr. 3, 2018.

(51) Int. Cl.
*G01R 31/367* (2019.01)
*G01R 31/3835* (2019.01)
*H01M 10/42* (2006.01)
*H01M 10/48* (2006.01)

(52) U.S. Cl.
CPC ....... *G01R 31/367* (2019.01); *G01R 31/3835* (2019.01); *H01M 10/425* (2013.01); *H01M 10/482* (2013.01); *H01M 2010/4271* (2013.01)

(58) Field of Classification Search
CPC ............ G01R 31/367; G01R 31/3835; H01M 10/425; H01M 10/482; H01M 2010/4271
USPC .......................................................... 702/63
See application file for complete search history.

(56) References Cited

U.S. PATENT DOCUMENTS

| | | | | |
|---|---|---|---|---|
| 2011/0196632 | A1* | 8/2011 | Shimizu | G01R 35/00 |
| | | | | 702/63 |
| 2012/0183016 | A1* | 7/2012 | Kanai | G01K 7/01 |
| | | | | 374/163 |
| 2013/0201587 | A1* | 8/2013 | Baek | G01R 31/396 |
| | | | | 361/86 |

(Continued)

FOREIGN PATENT DOCUMENTS

JP        H0679058        * 10/1994

OTHER PUBLICATIONS

Definition of coupled, printed on Mar. 17, 2022. (Year: 2022).*

(Continued)

*Primary Examiner* — Michael P Nghiem
(74) *Attorney, Agent, or Firm* — North Weber & Baugh LLP; Michael V. North

(57) ABSTRACT

Software-configurable battery monitoring and management systems and methods provide flexibility in selecting the location where the highest voltage in a block of cells is sensed so as to support control boards to connect to any number of cells. In certain embodiments, battery management is accomplished by measuring cell voltages in a block of cells in a battery stack, determining whether the battery stack comprises a bus bar, determining a sum of the individual cell voltages, and comparing the voltage at the top of a battery stack, including any bus bar, to the sum of the individual cell voltages to obtain a comparison result that may be used to perform a diagnostic procedure.

19 Claims, 4 Drawing Sheets

(56) References Cited

U.S. PATENT DOCUMENTS

2014/0042980 A1* 2/2014 Floros ................ H01M 10/441
320/134
2019/0353713 A1* 11/2019 Fifield .............. G01R 19/16542
2020/0355747 A1* 11/2020 An ...................... H01M 10/425

OTHER PUBLICATIONS

English translation of JPH0679058, Oct. 1994. (Year: 1994).*
Definition of Adjacent, Dictionary.com, printed on Mar. 2, 2023. (Year: 2023).*

* cited by examiner

SOFTWARE-CONFIGURABLE BATTERY MANAGEMENT SYSTEMS AND METHODS

CROSS-REFERENCE TO RELATED APPLICATIONS

This patent application is related to and claims priority benefit under 35 U.S.C. § 119(e) to and commonly-owned U.S. Provisional Patent Application No. 62/652,225, entitled "SOFTWARE-CONFIGURABLE BATTERY MANAGEMENT SYSTEMS AND METHODS," naming as inventors Antoine D. Fifield, Jiuhui Wang, and Daniel James Miller, and filed Apr. 3, 2018, which patent document is incorporated by reference herein in its entirety and for all purposes.

TECHNICAL FIELD

The present disclosure relates generally to systems and methods for managing energy storage devices. More particularly, the present disclosure related to systems and methods for monitoring, controlling, and protecting rechargeable batteries.

BACKGROUND

A rechargeable high-power battery is a collection of individual cells that are grouped into stacks or blocks of cells that may be stacked to form a single battery, such that the top of the battery stack has the highest voltage and the bottom cell has the lowest voltage. Given the increasing energy densities of modern high-performance batteries and an even faster growing demand for rapid charging, events that exceed safe charging and discharging current, voltage, temperature, and other parameters are likely to cause permanent damage to circuits, e.g., physical damage caused by overheated cells sue to Li-Ion cells being charged below or above a manufacturer-recommended voltage limits.

For safety, user-friendliness, and regulatory compliance reasons, charging and discharging voltages are typically monitored, e.g., as part of a redundant safety check to ensure operation within acceptable ranges so as to prevent system failure, accidental damage, or simply a degradation in performance and battery-life.

Another reason to monitor battery voltage is that different cells in a battery do not have the exact same cell chemistry. This causes variations in internal resistance that result in unequal charging times and varying output (i.e., open circuit) voltages for otherwise identical cells. Under ideal operating conditions, each cell in a block of cells is fully chargeable to the exact same capacity and generates the same, highest allowable open circuit voltage, such that the collection of cells in a battery stack maintains the highest possible total battery voltage. This would eliminate the need for energy transfer and charge redistribution and ensure optimal utilization of a battery's capacity.

However, due to manufacturing variances, it is virtually impossible to manufacture cells with identical electrical properties to store and provide the same maximum amount of charge a battery can hold. For example, to reach identical open circuit voltages, a cell having a high internal impedance will require a higher charging current than a cell having lower internal impedance. Similarly, the weakest (i.e., most degraded) cell in a string of series-connected cells will have the lowest capacity (and open circuit voltage) and, thus, dominate the charging time of the entire string, leading to sub-optimal battery performance.

Inefficiencies caused by charge imbalance are exacerbated over time by changing load conditions (e.g., overcharging at short-duration regenerative braking), aging (breakdown of electrochemical material causing loss of capacity), hysteresis in a charge cycle, and other events that ultimately diminish battery life.

Therefore, it would be desirable to monitor and configure, in real-time and with minimal complexity, the condition of all cells that make up a battery, such that charge can be redistributed among cells as necessary in order to prevent undesirable overcharge and undercharge conditions.

In many applications, battery voltage is monitored by a voltage measuring system that us located on a PCB that has a dedicated voltage pin for sensing the highest voltage in a battery stack. This pin is external to the battery itself and connected to the top of the battery stack. Since, depending on the application, the number of cells in a stack may vary from battery to battery, traditional battery monitoring systems utilize either different PCBs for different battery stack configurations or a single PBC that is then manually configured according to the number of cells in any given stack. In other words, each board has a dedicated voltage sensing pin that has to be manually configured according to the number of cells that determines the location of the top voltage in the stack.

In addition, to reduce overall wiring and the complexity/inefficiencies associated therewith, many existing systems use a number of distributed monitoring circuits, e.g., boards that have a fixed number of pins that accommodate a fixed number of channels that supervise a fixed number of cells, e.g., 14 cells. In practice, the number of cells that share a control board is determined by the voltage rating of that board. Thus, a battery system comprising stacks of, e.g., eight cells will have to use a board that is customized for eight cells, a harnesses that is customized for eight cells, etc., designed to monitor and control exactly the number of channels as the to-be measured cells.

Alternatively, the user may pay a premium for a single high-capacity board design that can withstand the voltage of more than eight cells, e.g., 14 cells. In addition, the board will have to undergo any hardware and software modifications that are necessitated by the mismatch between the number of cells that the board is designed for and the number of cells the board is ultimately operated with. Such modifications include hardwiring switch pins into the board, or using jumpers that physically short channels in order to adjust number of cells to be controlled. Additional requirements of this alternative approach include scanning all channels of the board and then ignoring or masking data from unwanted channels as erroneous data. In addition to the added complexity, jumpers are prone to failure and, thus, not suitable for applications that operate under heightened safety standards, such as aerospace and electric vehicle applications.

Accordingly, to overcome the shortcoming of existing approaches, what is needed are monitoring systems and methods that provide flexibility in selecting the location where the highest voltage in a block of cells is sensed so as to support control boards to connect to any number of cells without the need for cumbersome hardware modifications or the added cost of customizing boards to match different numbers of cells in different designs.

SUMMARY

Embodiments of the present application provide software-configurable battery monitoring and management systems and methods that provide flexibility in selecting the location where the highest voltage in a block of cells is sensed so as to support control boards to connect to any number of cells, such as electrochemical cells.

In aspects of the application, a method for validating the voltage at the top of a battery stack comprises: obtaining individual cell voltages from measurements performed on one or more cells in a block of cells in a battery stack; determining whether the battery stack comprises a bus bar; determining a sum of the individual cell voltages, including any bus bar voltage; comparing the voltage at the top of a battery stack, including any bus bar, to the sum of the individual cell voltages to obtain a comparison result that may be used to detect a fault in the bus bar; and in response to the comparison result exceeding a predetermined threshold, initiating an action. The method may further comprise using at least a voltage between two adjacent cells in the block of cells to determine a location of the bus bar. the individual cell voltages may be sequentially measured to determine which of the one or more cells are coupled to the node and determine a voltage differential between adjacent cells. Further a cell having the highest voltage in the battery stack may be automatically determined.

In aspects of the application, a software-configurable battery management system comprises: a multiplexer that couples two or more battery stacks to an analog-to-digital converter; a software-configurable battery management circuit that may comprise a battery stack that comprises: a plurality of cells configured to couple to a voltage node; a bus bar coupled to the plurality of cells; switches configured to couple one or more of the plurality of cells to the voltage node; an amplifier coupled to the voltage node to amplify individual cell voltages of the one or more of the plurality of cells and a voltage representative of a voltage at the top of the battery stack; an adder circuit coupled to the amplifier, the adder circuit generates a sum of the individual cell voltages; and a processor coupled to the amplifier, the processor performing steps comprising collecting data to determine at least one of the presence and location of a bus bar in the battery stack, and comparing the sum of the individual cell voltages to the voltage at the top of a battery stack to obtain a comparison result.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

FIGURE ("FIG.") 1 is a schematic of an illustrative software-configurable battery management system, according to various embodiments of the present disclosure.

DETAILED DESCRIPTION OF EMBODIMENTS

Figure 1:
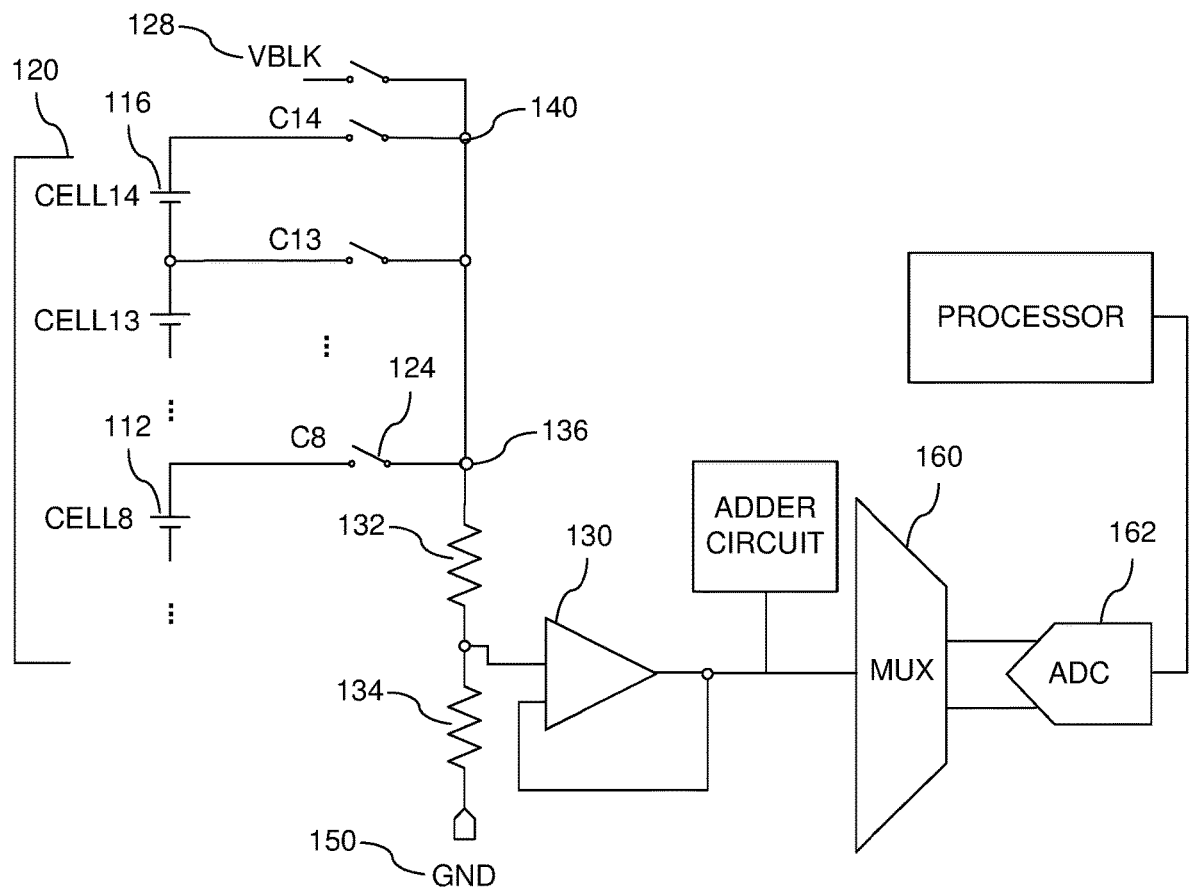

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated. Furthermore, the use of memory, database, information base, data store, tables, hardware, and the like may be used herein to refer to system component or components into which information may be entered or otherwise recorded.

Furthermore, it shall be noted that: (1) certain steps may optionally be performed; (2) steps may not be limited to the specific order set forth herein; (3) certain steps may be performed in different orders; and (4) certain steps may be done concurrently.

In this document "cell" and "battery cell" are used interchangeably. Similarly, the terms "pack" "stack," and "block," as in "stack of cells," "battery pack," "pack of cells," or "block of battery cells" may be used interchangeably. It is understood that the battery management systems and methods of the present disclosure may be applied to a wide variety of energy sources, such as high-capacity capacitors, Lithium-Ion cells, fuel cells, and other electrochemical and non-chemical cells and combinations thereof.

FIG. 1 is a schematic of an illustrative software-configurable battery management system, according to various embodiments of the present disclosure. System 100 comprises battery stack 120 that, in turn, comprises cells 112-116, switches 124, resistors 132-134, amplifier 130, multiplexer 160, and ADC 162.

Cell 112-116 is any type of energy source that generates a measurable voltage. In electrochemical cells, the cell voltage, i.e., the open circuit voltage, is generally a function of the capacity of the cell to hold electrical charge. In embodiments, cells 112-116 are battery cells that are electrically coupled in a series configuration. However, this is not a limitation on the scope of the present disclosure. One skilled in the art will appreciate that cells 112-116 may be implemented as any combination of series and parallel cell configurations.

In embodiments, individual cells (e.g., 112-116) are arranged to form battery stack 120 that comprises a certain number of cells (e.g., here, 14) that supply a battery with a voltage that equals the sum of each of the voltages of cells 112-116 that are connected in series, as shown in FIG. 1. It is noted that although only designs that range from 8 to 14 cells are presented herein, designs using the embodiments of present disclosure may have stacks comprising any number of cells. Several battery stacks 120 may be stacked together.

In operation, each cell 112 may be coupled to a dedicated switch 124 that allows individual cells or groups of cells to be tapped and coupled to node 136. As depicted in FIG. 1, resistor 132 that, together with resistor 134, forms a resistive divider is also coupled to node 136. Resistor 134 may be coupled to a reference potential, such as ground potential 150. In embodiments, the resistive divider aids in digitizing an analog voltage that is measured, e.g., at the top of battery stack 120 or at any of cells 112-116.

In embodiments, resistors 132-134 are coupled to amplifier 130, e.g., a differential amplifier that measures and amplifies a voltage drop at resistor 134. In embodiments, the voltage drop represents the highest voltage generated by battery stack 120. The amplified voltage may be provided to ADC 162, e.g., via multiplexer 160, which may receive voltage signals from any number of battery cells (e.g., here, cells 112-116), to determine a total battery voltage. A person of skill in the art will appreciate that multiplexer 160 may receive and multiplex any number of additional signals, e.g., diagnostic signals that may then be converted by ADC 162 and further processed as needed.

In embodiments, switch 124 may be a transistor that comprises an internal body-diode that is formed as a result of a semi-conductor process. It is understood that switch 124 may utilize any known switch driver to turn on and off. For example, if switch 124 is an NMOS device, it may utilize a small area charge pump (not shown) to switch between on and off states.

In embodiments, each cell 112-116 supplies a voltage (e.g., 4.2 V) that can be detected, for example by using amplifier 130, to sequentially measure individual cell voltages and determine a voltage differential between, e.g., adjacent cells. Once amplifier 130 provides the amplified voltages to ADC 162, they can be added, e.g., by an adder circuit (not shown), to obtain a sum of the voltages of individual cells 112-116. In embodiments, this voltage may then be compared to the total voltage of all cells measured, e.g., at node 136 that is coupled to the top plate of cell 14 116, in order to validate the measured total voltage. In embodiments, this total voltage is detected using resistor 134, and its value may be stored in a register (not shown). The value in the register may be updated each time a voltage scan is performed on cells 112-116. In embodiments, circuit 100, in order to be compatible with legacy devices, may comprise a so-called VBLOCK pin 128 that may be left floating, i.e., not connected by a switch to the rest of circuit 100.

In embodiments, an algorithm may be employed to perform sequential measurements of individual cell voltages, for example, by taking a measurement at cell 14 116, then cell 13, and so on, down to cell 8 112 in order to determine which cells are, in fact, coupled to node 136.

In embodiments, a number of switches 124 is arranged in a manner such that when switches 124 are opened, a combination of opposing body-diodes in switches 124 acts to block current flow through node 136, i.e., to resistive divider 132-134. In embodiments, resistive divider 132-134 divides the voltage at node 136 down to a suitable voltage value that can be measured by amplifier 130 and processed by ADC 162. It is noted that any number of battery stacks 120 may be evaluated in this manner using a single ADC 162 and a single multiplexer 160.

In embodiments, once the algorithm identifies the location of the cell that carries the highest voltage, that location may be used to define the highest voltage generated by battery stack 120. This provides a user with the flexibility to use software to configure switches 124 such as to select the location where the highest voltage in a block should be sensed and monitored, be it during regular operation, as part of an initialization procedure, or as a redundant safety check, for example, to verify the proper operation of cells 112-116 or to identify a fault condition.

In embodiments, proper operation is verified by using ADC 162 or similar circuit to compare the highest determined voltage, e.g., at switch VBLK 128 at the top of the battery stack, e.g., at location 140, to the sum of the voltages of cells 112-116, e.g., as diagnostic measurement to satisfy safety requirements, or to determine whether the difference between the two values exceeds a user-defined threshold. For example, if the sum of the individual voltages of cells 112-116 is not in agreement with the voltage at switch VBLK 128, his may indicate that one or more of cells 112-116 experience a malfunction. If so, in embodiments, an alarm or a safety notification may be generated and communicated, for example, to the user of system 100.

A person of skill in the art will appreciate that system 100 may be implemented in a single integrated circuit and be integrated with other systems, for example, as part of a vehicle management system. It is understood that while switch 124 may be implemented using one or more transistors that take advantage of internal body diodes, as discussed in greater detail with respect to FIG. 2, various embodiments may use other switches, such as mechanical relays, e.g., in combination with external diodes and other discrete electrical components. It is further understood that, while not shown in FIG. 1, system 100 may comprise additional components, such as logic circuitry that controls switch 124, independent power sources, and the like to facilitate interoperability between elements in system 100 and provide additional features, such as measuring or calculating power consumption based on obtained cell voltages.

Figure 2:
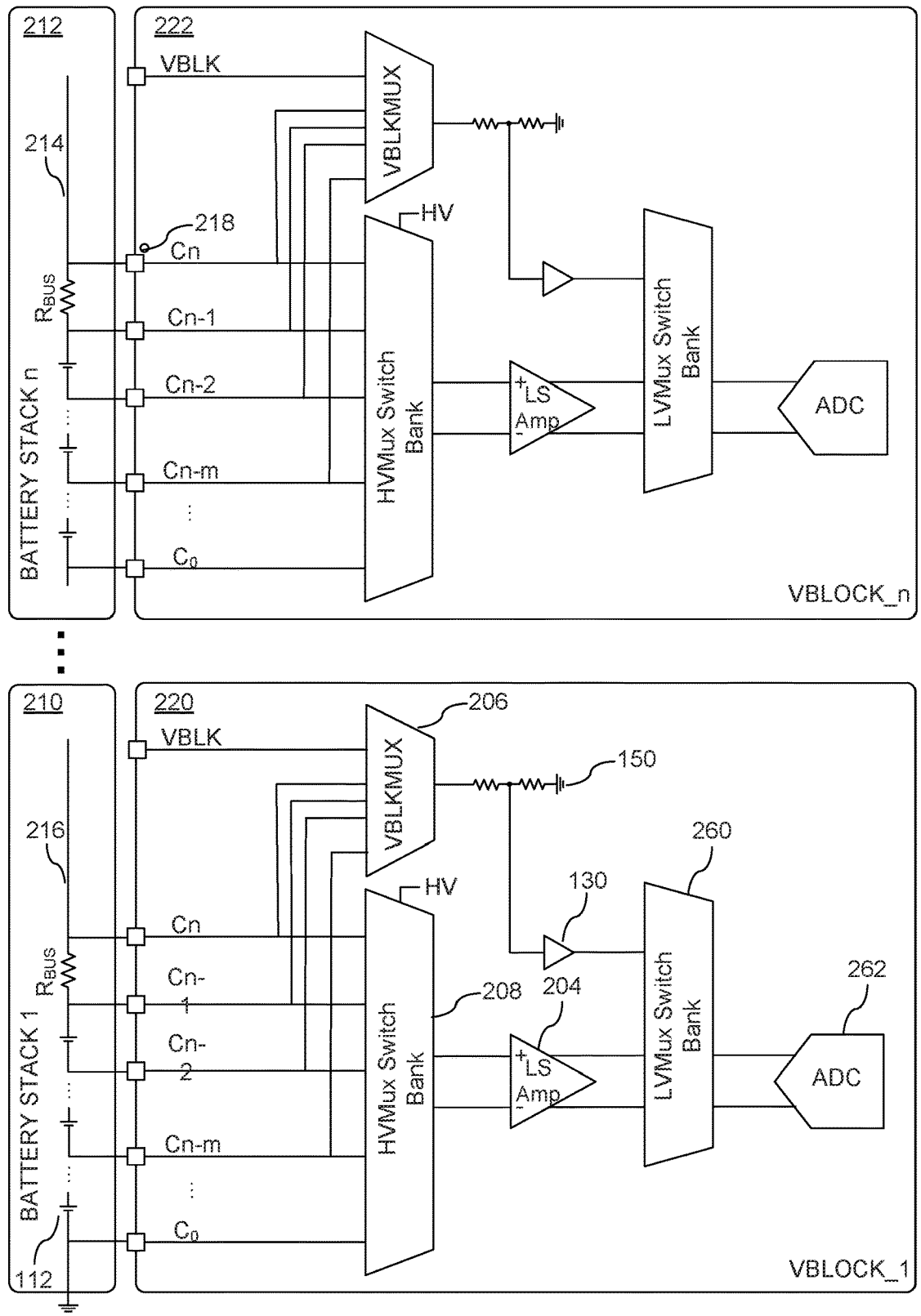
FIG. 2 is a schematic of an illustrative software-configurable circuit for validating the voltage at the top of a battery pack that that comprises battery stacks comprising a bus bar, according to various embodiments of the present disclosure.

FIG. 2 is a schematic of an illustrative software-configurable circuit for validating voltage at the top of a battery pack that that comprises battery stacks comprising a bus bar, according to various embodiments of the present disclosure. Same numerals as in FIG. 1 are labeled in the same manner. For purposes of brevity, a description or their function is not repeated here.

Circuit 200 comprises battery stack 210, 212 and circuit 220, 222 that each may comprise high-voltage multiplex switch bank 208, low-voltage signal amplifier 204, low-voltage multiplex switch bank 260, and ADC 262. In embodiments, each battery stack 210, 212 may comprise its own bus bar 214 that may be implemented as an electrical wire that connects battery stacks 210, 212 to each other. The bus bar (e.g., 216) may be coupled to the top pin 218, as shown in FIG. 2. In embodiments, individual battery stacks 210, 212 that provide power to a load, such as to an electric motor of an electric engine, may be connected to each other via bus bars (e.g., 214) that have intrinsic resistances.

In embodiments, ADC 262 may be implemented to operate in bipolar mode that performs bipolar measurements that allow to account for negative voltage values. ADC 262 may, alternatively, be configured to switch between a bipolar mode and a unipolar mode that allows measurements in a zero-to-full scale range.

In operation, because bus bar 214, 216 adds an impedance that would interfere with the cell voltage measurements, bus bar 214, 216 is ideally excluded from voltage measurements that determine the highest voltage in the stack 210, 212 itself. Therefore, it would be advantageous to know whether stack 210, 212 comprises a bus bar 214, 216 and its location, i.e., to known where stack 210, 212 ends.

In embodiments, when the top cell is connected to a pin (e.g., 218) that is coupled to a bus bar (e.g., 216), that cell may undergo a bipolar measurement, for example, to enable measurement of a negative voltage resulting from a current flowing into a battery. If instead of a bipolar measurement a unipolar measurement were to be used, the measurement would indicate a zero voltage rather than any negative voltage that may be present, thus, resulting in an erroneous measurement of the actual voltage that exists at the top of battery stack 210. In other words, the failure to measure a negative voltage would cause a discrepancy between measurements of the sum of the voltages of cells 112 and the safety measurement. Therefore, in embodiments, knowledge of the location of bus bar (e.g., 216) is used to make a determination whether ADC 262 should take a bipolar measurement rather than a unipolar measurement at pin 218.

In embodiments, a voltage between adjacent cells may be determined and used to distinguish between the presence of a bus bar (e.g., 216) and a cell. For example, knowing that a bus bar usually does not develop a voltage drop that exceeds, e.g., 500 mV even under peak current load conditions, and further knowing that a cell voltage, depending on cell chemistry and type, usually does not exceed, e.g., 1.5 V, a bus bar can be relatively easily distinguished from a cell.

Including bus bar 216 into voltage measurements, advantageously, also allows to detect certain faults in bus bar 216 itself. For example, in scenarios in which bus bar 216 experiences an open circuit condition, the resulting change in the impedance of the resistance string will cause a voltage measurement at pin 218 to indicate that open circuit condition.

In embodiments, circuit 200 in FIG. 2 utilizes multiplexer 206 to sequentially measure cell voltages at individual cells 112 and determine a voltage differential between, e.g., adjacent cells. A comparison and summation of cell voltages may be performed, e.g., by a microcontroller coupled to circuit 200. Once the location of all top cells and bus bars is known, a subsequent scan of cell voltages measures voltages at pins (e.g., 218) that are, in fact, connected to a cell (e.g., cell 112) or to a bus bar (e.g., bus bar 216), while excluding pins that are not so connected. Advantageously, this saves time and provides for a more efficient scan.

It is understood that, in embodiments, battery stack 210, 212 may be implemented as a low-voltage (e.g., a 48 V) circuit that does not utilize a bus bar, such that the top pin (e.g., 218) may be directly connected to the top cell in the battery stack, e.g., as illustrated in FIG. 1.

Figure 3:
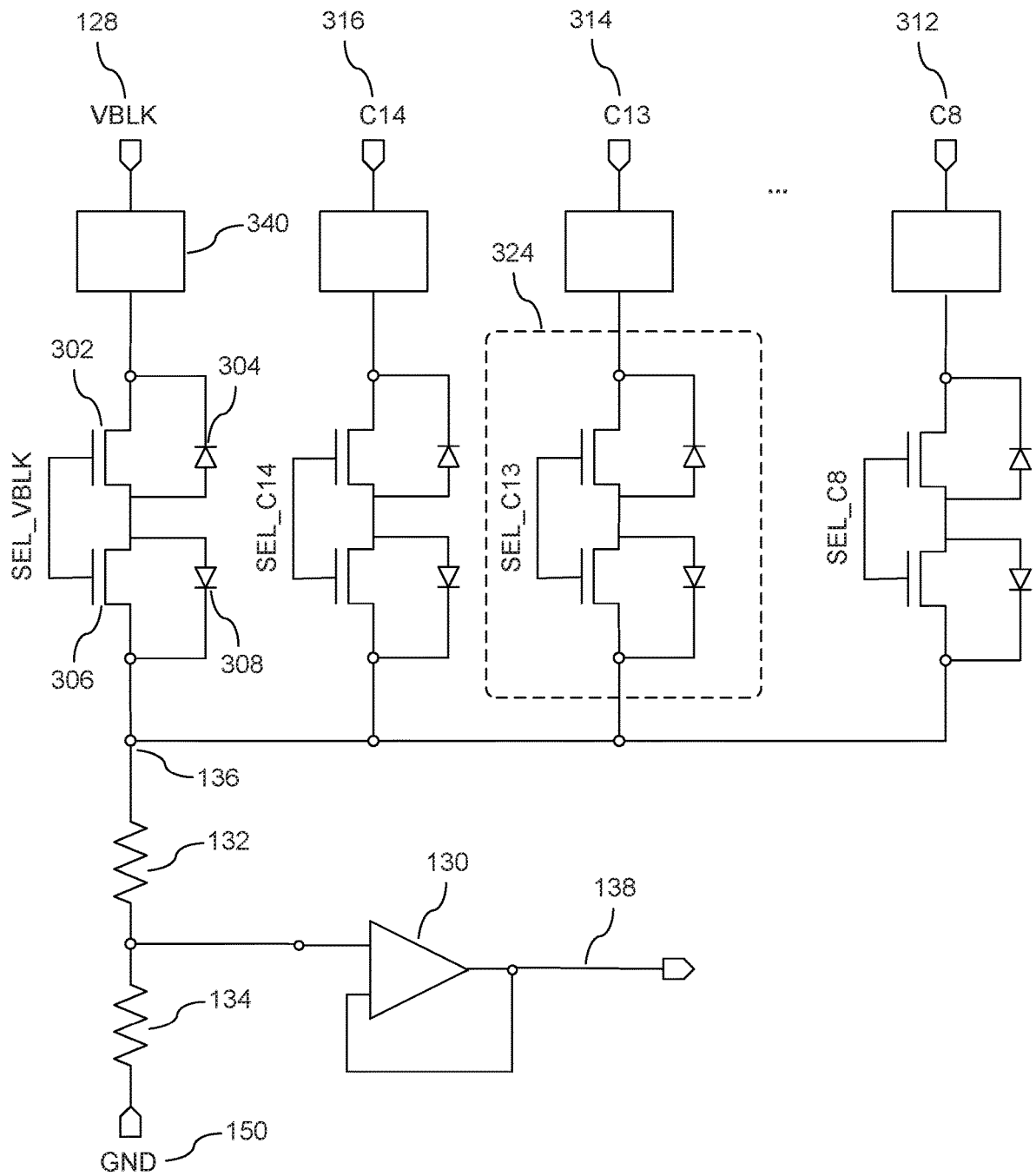
FIG. 3 is a schematic of an illustrative software-configurable circuit for validating the voltage generated at the top of a battery stack that comprises a bus bar, according to various embodiments of the present disclosure.

FIG. 3 is a schematic of an illustrative software-configurable circuit for validating the voltage generated at the top of a battery stack, according to various embodiments of the present disclosure. For clarity, components similar to those shown in FIG. 1 and FIG. 2 are labeled in the same manner. Circuit 300 comprises voltage pins 312-316, block voltage pin 128, switches 324, resistors 132-134, amplifier 130, and protection circuit 340, which may be an ESD diode or any other device that protects any number of components and interfaces of circuit 300.

Amplifier 130 may be used to measure a voltage drop across resistor 134 that represents the highest voltage generated by circuit 300. In embodiments, the amplified voltage may be multiplexed with other voltages before being provided to an ADC (not shown in FIG. 3) that can calculate a sum of the voltages present at voltage pins 312-316. In embodiments, each voltage pin 312-316 may be coupled to a cell, such as a battery cell that serves as a constant voltage source.

In embodiments, switch 324 may be a transistor circuit that comprises transistors 302, 306 that each comprise an internal body-diode 304 and 308, respectively. In embodiments, internal body-diodes 304, 308 have a common electrical connection, e.g., a common source pin of transistors 302, 306.

In operation, when transistors 302, 306 are configured such that switch 324 is open, and internal body diodes 304, 308 are directed in opposite direction, internal body diodes 304, 308 prevent current flow through switch 324 since irrespective to which end of switch 324 a higher (or lower) voltage is applied, one of body diodes 304, 308 will be reverse-biased, such that for the condition that the switch is turned off, current is prevented from flowing through the electrical path that comprises the two diodes 304, 308, in effect, isolating pins 312-316 from each other and allowing a software-configurable measurement of individual pins (and bus bars) without shorting cells to each other.

Advantageously, this removes resistive divider 132-134 as a load on the battery stack. More importantly, a voltage received at pin 312-316 will become measurable at resistor 134 without current flow through switch 324, i.e., without any additional voltage drop that otherwise would cause IR losses that interfere with the accuracy of the voltage measurement. Voltages applied to voltage pin 312-316 (less any voltage drop at internal body diodes 304, 308) may be detected by amplifier 130. In embodiments, amplifier 130 determines voltages between voltage pins 312-316 from which a voltage at particular voltage pin 312-316 may be determined.

In embodiments, resistive divider 132-134 divides the voltage down to a suitable voltage value that, as previously mentioned, can be measured by amplifier 130 and be output as an analog voltage signal 138 that may be digitized by an ADC and further processed.

Unlike in existing designs that use dedicated pins that are affixed to a board designed to be hardwired to monitor a fixed number of cells, embodiments presented herein provide a user with flexibility to determine which cell in a block of cells is to be treated as the top of the block, without having to externally connect anything to pin 128 and without having to hardwire each cell to pin 128. A user may select the location of pin 128 where the highest voltage in a block is sensed.

In embodiments, based on the determination of the highest voltage location, e.g., in normal operation or as part of an initialization procedure, that location may be used to perform a diagnostic procedure, e.g., a redundant, diagnostic safety measurement that verifies that all cells connected to voltage pins 312-316 operate as expected. In embodiments, voltage pin 128 may be left unused, i.e., at an electrically floating potential, by deselecting an option from a configuration menu.

In embodiments, voltage pin 128 may be used to accommodate legacy circuits and make the board fully backwards compatible to support voltage measurements on existing systems that are designed to expect voltage pin 128. In these embodiments, voltage pin 128 may be treated like any other input pin 312-316.

In embodiments, voltage pin 128 may be selectively connected to a bus bar as discussed with respect to FIG. 2. A bus bar may be included in the measurement of the highest voltage in circuit 300 in FIG. 3, e.g., to allow the user to obtain and keep track of the voltage that develops across the impedance of the bus bar. Therefore, in embodiments, voltage pin 128 may be connected to include the bus bar. For example, if a harness that has only eight wires is used for a board that is designed to accommodate 14 channels, the top five pins (pins 9-14) of the board may be left floating, voltage pin 128 may be coupled to cell 9 to include the bus bar, while the power input may be connected to cell 8 so as to exclude the bus bar.

The circuit depicted in FIG. 3 is not limited to the constructional details shown therein or described in the accompanying text. As those skilled in the art will appreciate, a suitable monitoring system may, for example, determine some or all voltages by measuring current instead and then transforming the result into voltage information.

Figure 4:
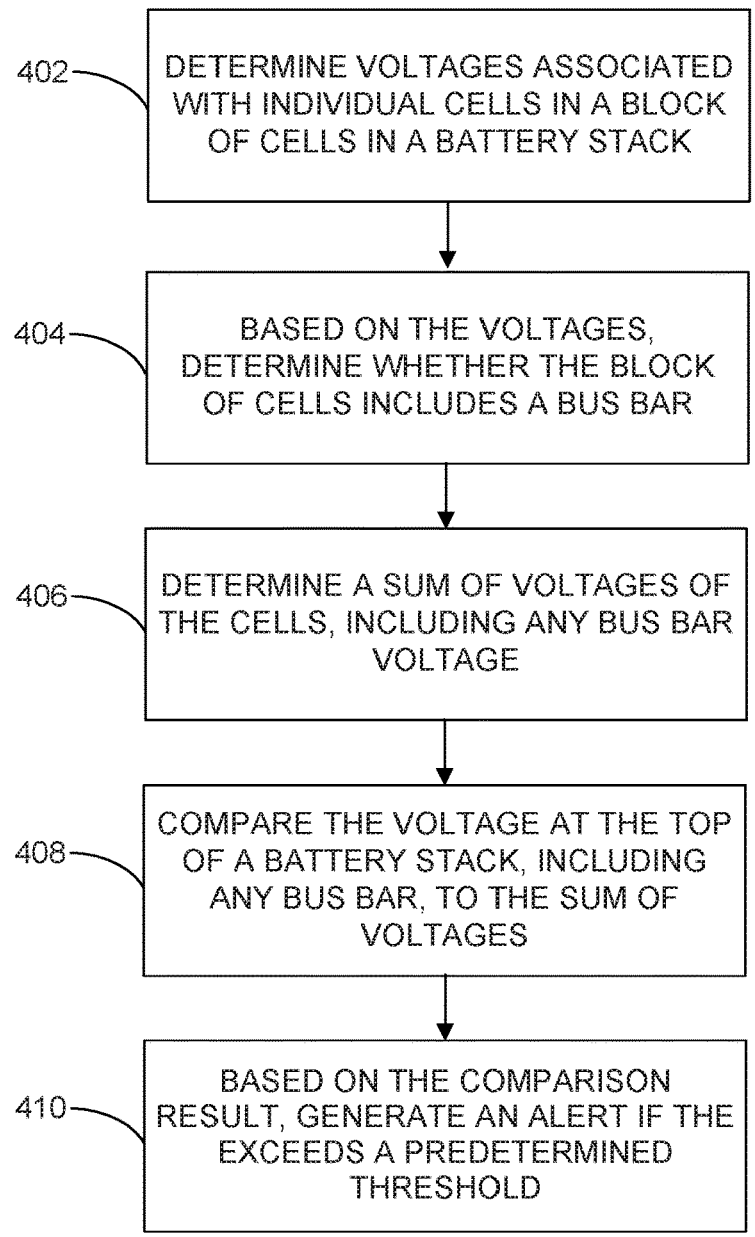
FIG. 4 is a flowchart of an illustrative process for validating the voltage at the top of a battery stack in accordance with various embodiments of the present disclosure.

FIG. 4 is a flowchart of an illustrative process for validating the voltage at the top of a battery stack in accordance with various embodiments of the present disclosure. Validation process 400 starts at step 402 when, in embodiments, voltages associated with individual cells in a block of cells in a battery stack is determined, e.g., via an ADC measurement that measures voltages on voltage nodes that may or may not be coupled to a cell.

At step 404, the ADC measurement may be used to determine the presence and location of a bus bar, for example, relative to the cells in the block and as part of a diagnostic measurement. In embodiments, an auxiliary circuit may be used to automatically locate the highest voltage in the block of cells, or a voltage related to the highest voltage. The highest voltage may be found, at a dedicated pin that is coupled to any of the cells in the block of cells or, if the block of cells comprises a bus bar, then at a pin that is coupled to the bus bar.

At step 406, a sum of voltages of the individual cells, including any bus bar voltage that may be present, is determined.

At step 408, the sum of voltages of the individual cells may be compared against the voltage at the top of the battery stack, including any bus bar voltage to obtain a comparison result.

Finally, at step 410, once the result exceeds a threshold, e.g., a user-selectable threshold, the result of the comparison may be used, e.g., to trigger a safety alert that initiates an emergency procedure. It is noted that additional steps may comprise turning off a portion of the circuit at certain times to reduce overall power consumption.

One skilled in the art will recognize no computing system or programming language is critical to the practice of the present invention. One skilled in the art will also recognize that a number of the elements described above may be physically and/or functionally separated into sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A software-configurable battery management circuit, the battery management circuit comprising:
    a plurality of cells arranged within a battery stack and configured to couple to a voltage node;
    a plurality of switches coupled to the plurality of cells and configured to couple one or more of the plurality of cells to the voltage node;
    an amplifier coupled to the voltage node via a resistive voltage divider, the amplifier amplifying:
        individual cell voltages of the one or more of the plurality of cells; and
        a voltage representative of a voltage at a top of the battery stack; and
    a processor coupled to the amplifier, the processor performing steps comprising:
        comparing a sum of the individual cell voltages of the one or more of the plurality of cells to the voltage at the top of a battery stack, including any wire voltage or bus bar voltage, to obtain a comparison result; and
        based on the comparison result, determining whether the battery stack comprises at least one of a wire or a bus bar.

2. The battery management circuit according to claim 1, wherein the processor uses the comparison result to perform a diagnostic procedure.

3. The battery management circuit according to claim 1, wherein the processor uses at least a voltage between two proximate cells among the plurality of cells to determine a location of at least one of the wire or the bus bar.

4. The battery management circuit according to claim 1, further comprising an analog-to-digital converter (ADC) coupled to the amplifier, the ADC operates, based on the battery stack comprising at least one of the wire or the bus bar, in a bipolar mode to accommodate a negative voltage value.

5. The battery management circuit according to claim 1, wherein the processor uses the comparison result to determine a fault in at least one of the wire or the bus bar.

6. The battery management circuit according to claim 1, wherein the plurality of switches comprises body diodes that increase accuracy of the individual cell voltages by preventing current from flowing through the resistive voltage divider when the plurality of switches is reverse biased.

7. The battery management circuit according to claim 1, wherein the processor automatically determines a cell within the plurality of cells as having the highest voltage in the battery stack.

8. The battery management circuit according to claim 1, wherein the processor automatically determines which cells are coupled to the voltage node.

9. The battery management circuit according to claim 1, further comprising a floating pin that enables compatibility with legacy devices.

10. A method for validating a voltage at a top of a battery stack, the method comprising:

measuring one or more cells in a block of cells in a battery stack to obtain one or more individual cell voltages;

determining a sum of the one or more individual cell voltages, including any wire voltage or bus bar voltage;

comparing a voltage at a top of a battery stack, including any wire voltage or bus bar voltage, to the sum of the one or more individual cell voltages to obtain a comparison result;

based on the comparison result, determining at least one of a presence or a location of at least one of a wire or a bus bar; and in response to the comparison result exceeding a predetermined threshold, initiating an action.

11. The method according to claim 10, wherein the one or more individual cell voltages are sequentially measured to determine which of the one or more cells are coupled to a voltage node.

12. The method according to claim 11, using the sequentially measured one or more individual cell voltages to determine a voltage differential between proximate cells.

13. The method according to claim 10, further comprising automatically determining a cell having the highest voltage in the battery stack.

14. The method according to claim 10, further comprising using the comparison result to detect a fault in at least one of the wire or the bus bar.

15. A software-configurable battery management system comprising:
   a software-configurable battery management circuit comprising:
      a battery stack comprising:
         a plurality of cells configured to couple to a voltage node;
         at least one of a wire or a bus bar coupled to the plurality of cells;
         switches configured to couple one or more of the plurality of cells to the voltage node;
         an amplifier coupled to the voltage node to amplify:
            individual cell voltages of the one or more of the plurality of cells; and
            a voltage representative of a voltage at a top of the battery stack; and
         a processor coupled to the amplifier, the processor performing steps comprising:
            comparing a sum of the individual cell voltages to the voltage at the top of a battery stack, including any wire voltage or bar bus voltage, to obtain a comparison result; and
            based on the comparison result, determine at least one of a presence or a location of at least one of the wire or the bus bar in the battery stack.

16. The battery management system according to claim 15, further comprising one or more multiplexers that are used to couple two or more battery stacks to one or more analog-to-digital converters.

17. The battery management system according to claim 15, wherein the plurality of cells comprises electrochemical cells.

18. The battery management system according to claim 15, wherein the processor automatically determines whether a cell within the plurality of cells as has the highest voltage in the battery stack.

19. The battery management system according to claim 15, wherein the processor uses the comparison result to determine a fault in at least one of the wire or the bus bar.

* * * * *